United States Patent
Chen et al.

(10) Patent No.: US 9,484,218 B2
(45) Date of Patent: Nov. 1, 2016

(54) POST ION IMPLANT STRIPPER FOR ADVANCED SEMICONDUCTOR APPLICATION

(75) Inventors: ChienShin Chen, Taichung (TW); MeiChin Shen, Yangmei (TW); ChiaHao Chan, Jhubei (TW); Andreas Klipp, Lambsheim (DE)

(73) Assignee: BASF SE, Ludwigshafen (DE)

( * ) Notice: Subject to any disclaimer, the term of this patent is extended or adjusted under 35 U.S.C. 154(b) by 672 days.

(21) Appl. No.: 13/387,787

(22) PCT Filed: Jul. 26, 2010

(86) PCT No.: PCT/EP2010/060762
§ 371 (c)(1),
(2), (4) Date: Jan. 30, 2012

(87) PCT Pub. No.: WO2011/012559
PCT Pub. Date: Feb. 3, 2011

(65) Prior Publication Data
US 2012/0129747 A1    May 24, 2012

Related U.S. Application Data (60) Provisional application No. 61/229,760, filed on Jul. 30, 2009.

(51) Int. Cl.
*H01L 21/311* (2006.01)
*G03F 7/42* (2006.01)
*C11D 11/00* (2006.01)

(52) U.S. Cl.
CPC ......... *H01L 21/31133* (2013.01); *G03F 7/425* (2013.01); *C11D 11/0047* (2013.01)

(58) Field of Classification Search
CPC ... C11D 11/0047; C11D 7/3218; C11D 3/30; C11D 7/34; G03F 7/425
USPC .................................. 510/175, 176; 134/1.3
See application file for complete search history.

(56) References Cited

U.S. PATENT DOCUMENTS 5,612,304 A * 3/1997 Honda et al. ................. 510/176
6,211,127 B1   4/2001 Kim et al.
(Continued)

FOREIGN PATENT DOCUMENTS

| JP | 11-084686 | 3/1999 |
| JP | 2000-39727 | 2/2000 |

(Continued)

OTHER PUBLICATIONS

International Search Report issued on Jan. 25, 2011 in PCT/EP10/060762 filed on Jul. 26, 2010.
(Continued)

*Primary Examiner* — Gregory Webb
(74) *Attorney, Agent, or Firm* — Oblon, McClelland, Maier & Neustadt, L.L.P.

(57) ABSTRACT

The present invention relates to a substantially water-free photoresist stripping composition. Particularly, the present invention relates to a substantially water-free photoresist stripping composition useful in removing the photoresist after ion-implant process, comprising: (a) an amine, (b) an organic solvent A, and (c) a co-solvent, wherein the composition is substantially water-free (<3 wt % $H_2O$). The present invention also provides a process for post-ion implantation stripping by using the composition of the present invention.

22 Claims, 2 Drawing Sheets

(56) References Cited

U.S. PATENT DOCUMENTS

| | | |
|---|---|---|
| 6,368,421 B1* | 4/2002 | Oberlander et al. ............ 134/40 |
| 6,551,973 B1 | 4/2003 | Moore |
| 2003/0130149 A1* | 7/2003 | Zhou et al. ................. 510/176 |
| 2003/0148624 A1 | 8/2003 | Ikemoto et al. |
| 2004/0106532 A1 | 6/2004 | Yokoi et al. |
| 2004/0147421 A1* | 7/2004 | Charm et al. ................ 510/176 |
| 2004/0152022 A1* | 8/2004 | Baik et al. .................... 430/331 |
| 2005/0089489 A1* | 4/2005 | Carter ......................... 424/70.1 |
| 2007/0027052 A1 | 2/2007 | Yokoi et al. |
| 2009/0111726 A1 | 4/2009 | Shang |
| 2009/0203566 A1* | 8/2009 | Lee et al. ..................... 510/175 |
| 2010/0304312 A1 | 12/2010 | Yokoi et al. |

FOREIGN PATENT DOCUMENTS

| | | |
|---|---|---|
| JP | 2001-215736 | 8/2001 |
| JP | 2002-357908 | 12/2002 |
| JP | 2003-228179 | 8/2003 |
| JP | 2003-228180 | 8/2003 |

OTHER PUBLICATIONS

U.S. Appl. No. 13/319,187, filed Nov. 7, 2011, Klipp.

U.S. Appl. No. 13/265,647, filed Oct. 21, 2011, Klipp.

\* cited by examiner

POST ION IMPLANT STRIPPER FOR ADVANCED SEMICONDUCTOR APPLICATION

FIELD OF THE INVENTION

The present invention relates to a composition for photoresist stripping. Particularly, the present invention relates to a composition for post-ion implantation photoresist stripping.

BACKGROUND OF THE INVENTION

Ion implantation is one of the key processes in the fabrication of semiconductor devices. Dopant ions such as boron, phosphorus or arsenic are created from a high purity gas source and implanted in a semiconductor substrate. Each doped atom creates a charge carrier, either hole or electron and thus modifies the conductivity of the semiconductor device in its vicinity. Ion implantation is commonly applied to the source/drain junction and the channel to achieve desired electrical characteristics of the devices to be produced.

In a typical ion implantation process, a substrate (e.g., silicon wafer) is first subjected to an organic chemical pre-treatment and then a positive-tone photoresist is coated on the substrate. After hot baking, edge bead removal, exposure, development and spin-drying steps, an organic photoresist mask is formed. During ion implantation process, dopants penetrate into the exposed (unmasked) surface of the substrate as well as the photoresist mask. The dopants may react with the photoresist mask to form a relatively nonporous layer, which is commonly known as a "crust." After completion of the ion implantation process, the photoresist mask is then removed by a stripping process. Typical post-ion implantation stripping is done by a dry plasma ashing followed by a wet piranha clean (which uses a mixture of sulfuric acid and hydrogen peroxide as clean agents) and a marangoni dry. Although the above process is widely used in the semiconductor industry, some drawbacks such as long process time and damage to silicon substrates have been noted. Silicon substrate damage such as silicon loss has become a key issue as the critical dimension shrinks to 45 nm and below. Silicon loss of greater than 30 Å may result in undesirable dopant out diffusion and cause device malfunction. For these reasons, the typical process for post-ion implantation stripping process is no longer acceptable and there is need for a new process.

Various methods for removal of the photoresist after ion implantation process are discussed in prior art. For example, U.S. Pat. No. 6,524,936 entitled to Hallock et al. discloses a method which exposes a wafer under UV radiation of 200 nm to 400 nm and at least 100 mJ/cm2 prior to conventional wet or dry stripping processes. In U.S. Pat. No. 5,811,358 entitled to Tseng et al., a three-step procedure is disclosed. The substrate is first stripped with an oxygen and nitrogen/hydrogen plasma at a low temperature (<220° C.) to minimize the photoresist solvent popping problem. Then, a higher temperature (>220° C.) is employed to remove the remaining photoresist. Finally, the substrate is cleaned with ammonium hydroxide and hydrogen peroxide mixtures. Nevertheless, the abovementioned approaches still suffer from unacceptable silicon loss.

Photoresist stripping compositions are disclosed in numerous prior art. For example, U.S. Pat. No. 6,551,973 entitled to Moore discloses a stripping composition comprising benzyl-trimethylammonium hydroxide (BTMAH) and a solvent system comprising alkylsulfoxide and optionally a glycol co-solvent, corrosion inhibitor and non-ionic surfactant for removing polymeric organic substances from metalized inorganic substrates. In U.S. Publication No. 2007/0099805 to Phenis et al., a stripper solution comprising dimethyl sulfoxide and a quaternary ammonium hydroxide and an alkanolamine is disclosed. However, attempts to employ conventional stripping compositions to remove a photoresist after ion implantation, especially heavy dose ion implantation, have always failed because the photoresist becomes nonporous and forms a crust after ion implantation. The nonporous crust prevents the penetration of the wet chemicals into the inner portion of the photoresist and thus significantly reduces the contact area between the wet chemicals and photoresist. In addition, the crust portion is highly non-uniform and thus the process difficulty of a wet clean is increased. Accordingly, post-ion implantation stripping by conventional wet chemicals is impractical.

SUMMARY OF THE INVENTION

One of the objects of the invention is to provide a substantially water-free photoresist stripping composition which is useful in removing the photoresist after ion implantation process. The composition of the present invention comprises:
 (a) an amine,
 (b) an organic solvent A, and
 (c) a co-solvent,
 wherein the composition is substantially water-free.

In a preferred embodiment of the present invention, the amine is a quaternary ammonium hydroxide.

In a more preferred embodiment of the present invention, the amine is benzyl-trimethylammonium hydroxide (BTMAH).

In another more preferred embodiment of the present invention, the amine is a tetramethylammonium hydroxide (TMAH).

Another object of the present invention is to provide a method for post-ion implantation stripping. The method comprises the steps of:
 (a) providing a substrate having implanted photoresists thereon, and
 (b) contacting the substrate with the composition of the present invention for a period of time sufficient to remove the photoresist from the substrate.

DETAILED DESCRIPTION OF THE INVENTION

The first object of the present invention is to provide a photoresist stripping composition capable of removing photoresist from a substrate after ion implantation. The stripping composition of the present invention comprises:
 (a) an amine,
 (b) an organic solvent A, and
 (c) a co-solvent,
 wherein the composition is substantially water-free.

The amine in the composition of the present invention can break down the polymeric frameworks of the cured photoresist and lift off fragments of the cured photoresist.

Any suitable primary, secondary, tertiary or quaternary amines can be used in the composition of the present invention. Suitable primary amines include, but are not limited to, ethanolamine (MEA), N-methylethanolamine (NMEA), cyclohexylamine and hydroxylamine (HA). Suitable secondary amines include, but are not limited to, diethylhydroxyliamine, diethylamine and quinoline. Suitable tertiary amines include, but are not limited to, dimethylethanolamine and trimethylamine. Suitable quaternary amines include, but are not limited to, tetramethylammonium hydroxide (TMAH), benzyl-trimethylammonium hydroxide (BTMAH), tetraethylammonium hydroxide (TEAH) and tetrabutylammonium hydroxide (TBAH).

Preferred amines are quaternary ammonium hydroxides. Among the quaternary ammonium hydroxides, BTMAH and TMAH are surprisingly effective and thus are most preferred.

The amount of amine in the composition of the present invention can vary from 1 to 10 wt %, preferably 1 to 4 wt %.

Figure 1:
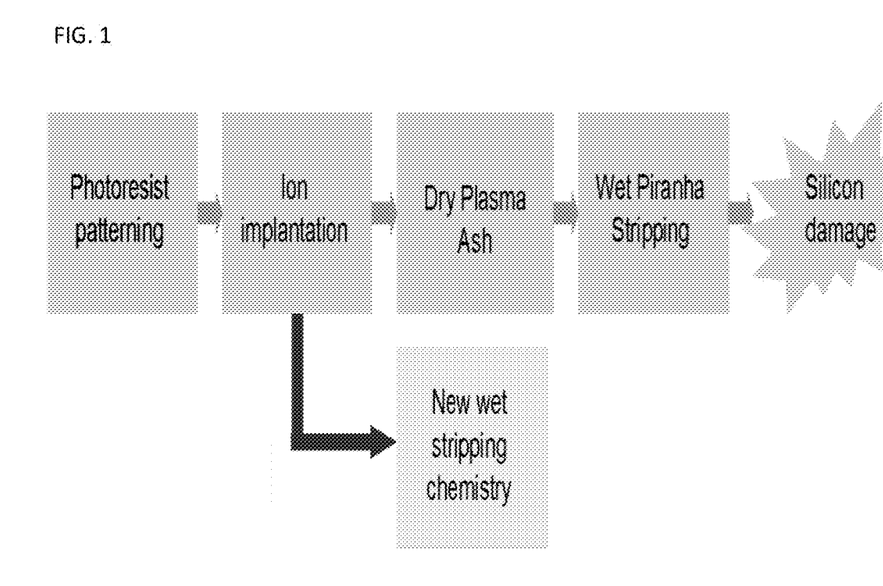
FIG. 1 is a schematic flow chart comparing typical post-ion implantation stripping with the process of the present invention.
Figure 2:
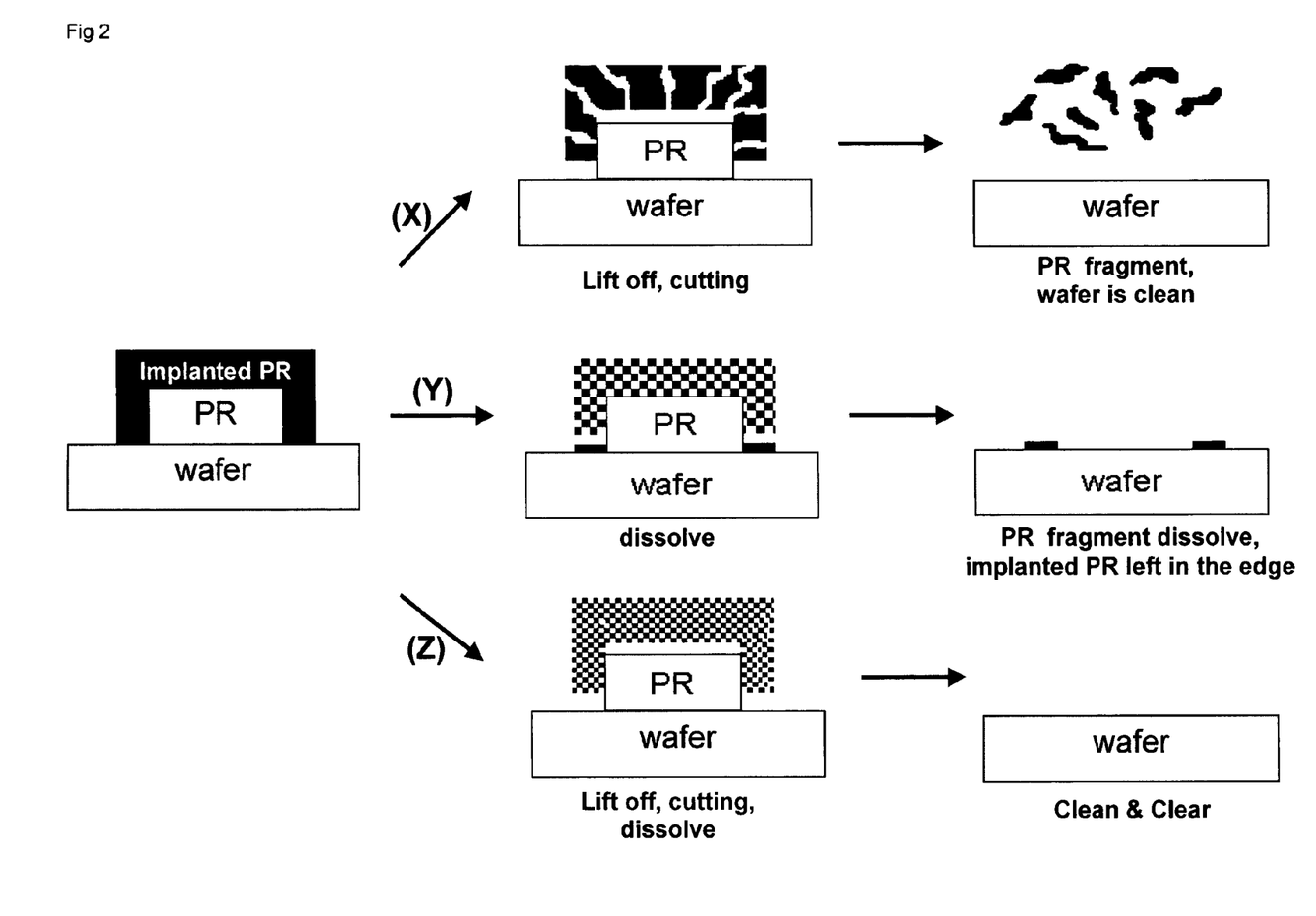
FIG. 2 is a schematic diagram of possible mechanisms in a stripping process.

The organic solvent A and co-solvent of the present invention function differently. The organic solvent A of the present invention is capable of removing photoresists from the substrate by lift-off and cutting mechanisms, which are shown as (X) in FIG. 2. Using solvent A alone without a co-solvent can lift off photoresists from the substrate, but the stripper solution then becomes turbid due to the suspended photoresist fragments in the solution. The photoresist fragments will decrease the load capacity of the stripping composition and contaminate the substrate as well as the equipment.

On the other hand, the co-solvent of the present invention is less effective in lifting photoresists from a substrate, but can dissolve photoresist fragments so as to increases the load capacity of the stripping composition. The co-solvent alone cannot completely remove the photoresist from a substrate and some photoresist residues, especially the "crust," will remain on the substrate. The mechanism of the co-solvent is shown as (Y) in FIG. 2.

Accordingly, the composition of the present invention properly combines a solvent A and a co-solvent to achieve excellent stripping performance. The mechanism is schematically shown as (Z) in FIG. 2.

Solvent A and the co-solvent must be carefully selected. For safety, a suitable solvent A and the co-solvent should have a flash point higher by at least 10° C., preferably 30° C., than the process temperature and a boiling point at least 40° C. higher than the process temperature. The melting point should be lower than room temperature and preferably lower than 0° C. to avoid crystallization during storage or shipping. Nevertheless, if a single solvent does not have all of the above physical properties, for example DMSO has a melting point of 18.5° C. but is particularly effective at lifting off or dissolving implanted photoresists, it can be mixed with other suitable solvent(s) to meet the requirements.

A suitable organic solvent A is selected from alkysulfoxides, such as dimethyl sulfoxide (DMSO), dimethyl sulfone ($DMSO_2$) and sulfolane; ketones, such as 1-methyl-2-pyrrolidinone (NMP), γ-butyrolactone (BLO)(GBL), ethyl methyl ketone, 2-pentanone, 3-pentanone, 2-exanone and isobutyl methyl ketone; alcohols, such as $C_nH_{2n+1}OH$ wherein n=3 to 10, for example, 1-propanol, 2-propanol, butyl alcohol, pentanol, 1-hexanol, 1-heptanol, and 1-octanol, ethyldiglycol (EDG), butyldiglycol (BDG) and benzyl alcohol; aldehydes, such as benzaldehyde; alkanes, such as tridecane, dodecane, undecance and decance; amines, such as N,N-Dimethylethanolamine, di-n-propylamine, tri-n-propylamine, isobutylamine, sec-butylamine, cyclohexylamine, methylamiline, o-toluidine, m-toluidine, o-chloroaniline, m-chloroaniline, octylamine, N,N-diethylhydroxylamine, quinoline, N,N-dimethylethanolamine or N,N-dimethylformamide; or a combination thereof.

A suitable co-solvent is selected from alcohols, including primary, secondary and tertiary alcohols, such as isopropyl alcohols, isobutyl alcohols, sec-butyl alcohols, isopentyl alcohols, tert-pentyl alcohols, ethylene glycol (EG), propylene glycol, 1,2-propanediol, 1,3-propanediol, 1,2,3-propanetriol and 1-amino-2-propanol; esters, such as isopropyl acetate and ethyl acetoacetate; amines containing a hydroxy group, such as triethanol amine, ethanolamine (MEA), formamide, dimethylacetamide (DMAC), 2-(methylamino_ethanol (NMEA), and N-ethyldiisopropylamine; or a combination thereof.

Among the above organic solvents, DMSO, NMP, benzyl alcohol, propanol, butyldiglycol, pentanol, N,N-dimethylethanol amine, benzaldehyde or a mixture thereof is preferred for use in the present invention as solvent A. DMSO, NMP, benzyl alcohol, butyldiglycol and a mixture thereof are more preferred.

Ethylene glycol, 1,2-propanediol, 1-amino-2-propanol, triethanol amine, MEA, isopropyl acetate or a mixture thereof is preferred for use in the present invention as a co-solvent and ethylene glycol, triethanol amine, MEA or a mixture thereof is more preferred.

The amount of the solvent A and co-solvent basically ranges from 90 to 99 wt % of the composition, if no other additives are added. The ratio of the solvent A to co-solvent is not critical.

The stripping composition of the present invention can optionally contain additives such as chelating agents and surfactants. Suitable chelating agents include, but are not limited to, ethylenediaminetetraacetic acid (EDTA), diethylenetriaminepentaacetic acid (DTPA) and 2,4-pentanedione. Suitable surfactants include, but are not limited to, non-ionic alkoxylated alcohols, nonyl-phenols and nonyl-ethoxylates. The amount of each additive can vary depending on needs and can be decided by a skilled person in view of prior art. Preferably, the total amount of additives is less than about 1 wt % of the composition.

Unlike most conventional stripping compositions, the stripping composition of the present invention is substantially water-free, that is, the water content must be less than 3 wt %, preferably less than 1 wt %, and more preferably less than 0.5 wt % so as to prevent damage to a silicon substrate. Silicon loss is highly correlated with the water content of the composition.

Another object of the present invention is to provide a wet process for post-ion implantation. The method comprises the steps of:

(a) providing a substrate having implanted photoresists thereon, and (b) contacting the substrate with the composition of the present invention for a period of time sufficient to remove the photoresist from the substrate.

It should be noted that the stripping process of the present invention does not require dry plasma ashing, so it is advantageous in reduction of cycle time and energy consumed.

The method of the present invention can be performed in any suitable equipment such as conventional wet bench or cleansers. The contact of the substrate with the composition can be done by any suitable conventional means such as immersion, rinsing, spraying and jetting.

In a preferred embodiment of the present invention, the method is performed in a wet bench. The process can be conducted at a temperature of 25° C. to 90° C., preferably 40° C. to 80° C., and more preferably 60° C. to 80° C. The temperature is much lower than the process temperature of piranha clean, which is normally 120° C. to 140° C. It is believed that elevated temperature increases silicon loss of a substrate, so a lower temperature is beneficial.

Generally, implanted photoresists can be completely removed from a substrate in 20 min to 2 hr. Actual time depends on the types of photoresists, equipment used and process conditions.

EXAMPLES

The present invention is illustrated below in detail by the examples, which are not intended to limit the scope of the present invention. It will be apparent that any modifications or alterations that are obvious for persons skilled in the art fall within the scope of the disclosure of the specification.

Experiment 1 $H_2O$ vs. Polysilicon Etching Rate

The following experiments were performed to evaluate the influence of the water content on the polysilicon etching rate. Different amounts of TMAH or its methanol solution (Exp. 1 to 6) and methanol solutions of BTMAH (Exp. 7 to 9) were added into DMSO. Different amounts of water were added to some solutions (Exp. 1 to 5, 8 and 9). Polysilicon wafers were immersed in the solutions under various process conditions and the thickness difference of each wafer was measured. The results are shown in Table 1.

TABLE 1

| Poly-silicon Wafer | Formulation (wt. %) | Process Condition | Poly Si Etch Rate (Å/min) |
|---|---|---|---|
| Exp. 1 | 92%DMSO + 2% TMAH + 6%$H_2O$ | 40° C., 6 hr | >4 |
| Exp. 2 | 92%DMSO + 2% TMAH + 6%$H_2O$ | 60° C., 6 hr | >7 |
| Exp. 3 | 92%DMSO + 2% TMAH + 6%$H_2O$ | 80° C., 6 hr | >20 |
| Exp. 4 | 80%DMSO + 2% TMAH + 18%$H_2O$ | 80° C., 6 hr | >350 |
| Exp. 5 | 2% TMAH + 98%$H_2O$ | 80° C., 6 hr | >570 |

TABLE 1-continued

| Poly-silicon Wafer | Formulation (wt. %) | Process Condition | Poly Si Etch Rate (Å/min) |
|---|---|---|---|
| Exp. 6 | 84%DMSO + 4%TMAH + 12%MeOH | 80° C., 60 min | not detectable |
| Exp. 7 | 90%DMSO + 4% BTMAH + 6%MeOH | 80° C., 60 min | not detectable |
| Exp. 8 | addition of 1% $H_2O$ to exp. 7 | 80° C., 60 min | not detectable |
| Exp. 9 | addition of 3% $H_2O$ to exp. 7 | 80° C., 60 min | >0.5 |

The results show that the increase of $H_2O$ significantly increases the polysilicon etch rate. In addition, Exp. 1 to 3 show that higher temperature results in higher polysilicon etch rate.

Experiments 2 to 5

The stripping ability of different compositions under various conditions was tested, and the results are shown in the following Tables 2 to 5.

TABLE 2

| Exp. | amine (wt. %) | | solvent (wt. %) | temp. (° C.) | time (min) | PR removal ability | appearance of solution before stripping | appearance of solution after stripping |
|---|---|---|---|---|---|---|---|---|
| S-001 | amine | MEA | 4 | DMSO 96 | 60 | 60 | Ok | clear | turbid |
| S-002 | | Cyclohexyl-amine | 4 | 60 | 60 | Ok | clear | turbid |
| S-003 | | Diethylhydroxyl-amine | 4 | 60 | 60 | Ok | clear | turbid |
| S-004 | | Diethylamine | 4 | 60 | 60 | Ok | clear | turbid |
| S-005 | | Quinoline | 4 | 60 | 60 | Ok | clear | turbid |
| S-006 | | Dimethylethanol-amine | 4 | 60 | 60 | Ok | clear | turbid |
| S-007 | | Trimethylamine | 4 | 60 | 60 | Ok | clear | turbid |
| S-008 | | TBAH | 4 | 60 | 60 | Ok | clear | turbid |
| S-009 | | TMAH + MeoH | 4 + 12 | 84 | 60 | 60 | Ok | clear | turbid |
| S-010 | | BTMAH + MeOH | 4 + 6 | 90 | 60 | 60 | Ok | clear | turbid |

Table 2 shows that among the used amines, TMAH shows surprisingly effective photoresist stripping performance at the given process conditions. It should be noted that other amines are also capable of removing photoresists, although their performance is not as good as TMAH and BTMAH.

TABLE 3

| Exp. | amine (MeOH) (wt. %) | | solvent (wt. %) | temp. (° C.) | time (min) | performance |
|---|---|---|---|---|---|---|
| S-011 | TMAH | 4(12) | DMSO | 84 | 80 | 60 | A |
| S-009 | TMAH | 4(12) | DMSO | 84 | 60 | 60 | A |
| S-012 | TMAH | 4(12) | DMSO | 84 | 55 | 60 | B |
| S-013 | TMAH | 4(12) | DMSO | 84 | 50 | 60 | B |
| S-014 | TMAH | 4(12) | DMSO | 84 | 45 | 60 | B |
| S-015 | TMAH | 4(12) | DMSO | 84 | 60 | 45 | B |
| S-016 | TMAH | 4(12) | DMSO | 84 | 60 | 30 | B |
| S-017 | TMAH | 4(12) | DMSO | 84 | 60 | 15 | B |
| S-018 | TMAH | 3(9) | DMSO | 88 | 60 | 60 | A |
| S-019 | TMAH | 2(6) | DMSO | 92 | 60 | 60 | A |
| S-020 | TMAH | 1(3) | DMSO | 96 | 60 | 60 | A |
| S-021 | BTMAH | 4(6) | DMSO | 90 | 80 | 60 | A |

TABLE 3-continued

| Exp. | amine (MeOH) (wt. %) | | solvent (wt. %) | temp. (° C.) | time (min) | performance |
|---|---|---|---|---|---|---|
| S-022 | BTMAH | 4(6) | DMSO | 90 | 75 | 60 | A |
| S-023 | BTMAH | 4(6) | DMSO | 90 | 70 | 60 | A |
| S-024 | BTMAH | 4(6) | DMSO | 90 | 65 | 60 | B |
| S-025 | BTMAH | 4(6) | DMSO | 90 | 60 | 60 | C |
| S-026 | BTMAH | 4(6) | DMSO | 90 | 80 | 45 | A |
| S-027 | BTMAH | 4(6) | DMSO | 90 | 80 | 30 | B |
| S-028 | BTMAH | 4(6) | DMSO | 90 | 80 | 15 | B |
| S-029 | BTMAH | 3(4.5) | DMSO | 92.5 | 80 | 60 | A |
| S-030 | BTMAH | 2(3) | DMSO | 95 | 80 | 60 | A |
| S-010 | BTMAH | 1(1.5) | DMSO | 97.5 | 80 | 60 | A |

A: clean;
B: little PR residue on the wafer;
C: some PR residue on the wafer

Table 3 shows that the process window for TMAH is broader than BTMAH. For BTMAH, 60 min at 70° C. is required to complete the stripping. For TMAH, 60 min at 60° C. is required. As mentioned above, elevated temperature is disadvantageous because it increases the damage to silicon substrate.

TABLE 4

| Exp. | Amine (MeOH) (%) | | type | solvent A (%) | | temp. (° C.) | time (min) | Performance | appearance of solution before stripping | appearance of solution after stripping |
|---|---|---|---|---|---|---|---|---|---|---|
| S-031 | TMAH | 4(12) | alkysulfoxide | DMSO | 84 | 60 | 60 | A | clear | turbid |
| S-032 | TMAH | 4(12) | ketone | NMP | 84 | 60 | 60 | A | clear | turbid |
| S-033 | TMAH | 4(12) | amine | Triethanol amine | 84 | 60 | 60 | C | clear | clear |
| S-034 | TMAH | 4(12) | | N,N-Dimethyl-ethanolamine | 84 | 60 | 60 | A | clear | turbid |
| S-035 | TMAH | 4(12) | | MEA | 84 | 60 | 60 | C | clear | clear |
| S-036 | TMAH | 4(12) | Alcohol | Propanol | 84 | 60 | 60 | A | clear | turbid |
| S-037 | TMAH | 4(12) | | Pentanol | 84 | 60 | 60 | A | clear | turbid |
| S-038 | TMAH | 4(12) | | Butyldiglycol (BDG) | 84 | 60 | 60 | A | clear | turbid |
| S-039 | TMAH | 4(12) | | Benzl alcohol | 84 | 60 | 60 | A | clear | turbid |
| S-040 | TMAH | 4(12) | | Ethyl glycol | 84 | 60 | 60 | C | clear | clear |
| S-041 | TMAH | 4(12) | | 1,2-propanediol | 84 | 60 | 60 | C | clear | clear |
| S-042 | TMAH | 4(12) | | 1-amino-2-propanol | 84 | 60 | 60 | C | clear | clear |
| S-043 | TMAH | 4(12) | aldehyde | Benzaldehyde | 84 | 60 | 60 | A | clear | turbid |
| S-044 | TMAH | 4(12) | ester | Isopropyl acetate | 84 | 60 | 60 | C | clear | clear |

A: clean;
C: some PR residue on the wafer

Various solvents have been tested. Table 4 shows that the tested solutions either have acceptable photoresist removal ability but cause the solution to become turbid after stripping (which is classified as solvent A), or have poor photoresist removal ability but can dissolve photoresists (which is classified as a co-solvent). A solvent effective at both photoresist removal and dissolving is not found.

TABLE 5

| Exp. | Amine (MeOH) (%) | | solvent A (%) | | co-solvent (%) | | temp. (° C.) | time (min) | Performance | appearance of solution before stripping | appearance of solution after stripping |
|---|---|---|---|---|---|---|---|---|---|---|---|
| S-045 | TMAH | 4(12) | DMSO | 42 | Ethylene glycol | 42 | 60 | 60 | Ok | clear | clear |
| S-046 | TMAH | 4(12) | | 42 | 1,2-propanediol | 42 | 60 | 60 | Ok | clear | clear |
| S-047 | TMAH | 4(12) | | 12 | Triethanol | 72 | 60 | 60 | Ok | clear | clear |
| S-048 | TMAH | 4(12) | | 42 | amine | 42 | 60 | 60 | Ok | clear | clear |
| S-049 | TMAH | 4(12) | | 12 | MEA | 72 | 60 | 60 | Ok | clear | clear |
| S-050 | TMAH | 4(12) | | 42 | | 42 | 60 | 60 | Ok | clear | clear |
| S-051 | TMAH | 1(3) | | 10 | | 86 | 60 | 60 | Ok | clear | clear |
| S-052 | TMAH | 4(12) | NMP | 42 | Ethylene glycol | 42 | 60 | 60 | Ok | clear | clear |
| S-053 | TMAH | 4(12) | | 42 | 1,2-propanediol | 42 | 60 | 60 | Ok | clear | clear |

TABLE 5-continued

| Exp. | Amine (MeOH) (%) | solvent A (%) | | co-solvent (%) | | temp. (° C.) | time (min) | Performance | appearance of solution before stripping | after stripping |
|---|---|---|---|---|---|---|---|---|---|---|
| S-054 | TMAH 4(12) | | 42 | Triethanol amine | 42 | 60 | 60 | Ok | clear | clear |
| S-055 | TMAH 4(12) | | 42 | MEA | 42 | 60 | 60 | Ok | clear | clear |
| S-056 | TMAH 4(12) | Benzyl | 72 | Ethylene glycol | 12 | 60 | 60 | Ok | clear | clear |
| S-057 | TMAH 4(12) | alcohol | 42 | | 42 | 60 | 60 | Ok | clear | clear |
| S-058 | TMAH 4(12) | | 42 | 1,2-propanediol | 42 | 60 | 60 | Ok | clear | clear |
| S-059 | TMAH 1(3) | | 10 | | 86 | 60 | 60 | Ok | clear | clear |
| S-060 | TMAH 1(3) | | 86 | | 10 | 60 | 60 | Ok | clear | clear |
| S-061 | TMAH 4(12) | | 42 | 1-amino-2-propanol | 42 | 60 | 60 | Ok | clear | clear |
| S-062 | TMAH 1(3) | | 10 | | 86 | 60 | 60 | Ok | clear | clear |
| S-063 | TMAH 1(3) | | 86 | | 10 | 60 | 60 | Ok | clear | clear |
| S-064 | TMAH 4(12) | | 42 | Triethanol amine | 42 | 60 | 60 | Ok | clear | clear |
| S-065 | TMAH 1(3) | | 10 | | 86 | 60 | 60 | Ok | clear | clear |
| S-066 | TMAH 1(3) | | 86 | | 10 | 60 | 60 | Ok | clear | clear |
| S-067 | TMAH 4(12) | | 42 | MEA | 42 | 60 | 60 | Ok | clear | clear |
| S-068 | TMAH 1(3) | | 10 | | 86 | 60 | 60 | Ok | clear | clear |
| S-069 | TMAH 1(3) | | 86 | | 10 | 60 | 60 | Ok | clear | clear |
| S-070 | TMAH 4(12) | Pentanol | 42 | Ethylene glycol | 42 | 60 | 60 | Ok | clear | clear |
| S-071 | TMAH 1(3) | | 10 | | 86 | 60 | 60 | Ok | clear | clear |
| S-072 | TMAH 4(12) | | 42 | 1,2-propanediol | 42 | 60 | 60 | Ok | clear | clear |
| S-073 | TMAH 1(3) | | 10 | | 86 | 60 | 60 | Ok | clear | clear |
| S-074 | TMAH 4(12) | | 42 | Triethanol amine | 42 | 60 | 60 | Ok | clear | clear |
| S-075 | TMAH 1(3) | | 10 | | 86 | 60 | 60 | Ok | clear | clear |
| S-076 | TMAH 1(3) | | 86 | | 10 | 60 | 60 | Ok | clear | clear |
| S-077 | TMAH 4(12) | | 42 | MEA | 42 | 60 | 60 | Ok | clear | clear |
| S-078 | TMAH 1(3) | | 10 | | 86 | 60 | 60 | Ok | clear | clear |
| S-079 | TMAH 1(3) | | 86 | | 10 | 60 | 60 | Ok | clear | clear |
| S-080 | TMAH 4(12) | Propanol | 42 | Ethylene glycol | 42 | 60 | 60 | Ok | clear | clear |
| S-081 | TMAH 4(12) | | 42 | 1,2-propanediol | 42 | 60 | 60 | Ok | clear | clear |
| S-082 | TMAH 4(12) | | 42 | 1-amino-2-propanol | 42 | 60 | 60 | Ok | clear | clear |
| S-083 | TMAH 1(3) | | 10 | | 86 | 60 | 60 | Ok | clear | clear |
| S-084 | TMAH 1(3) | | 86 | | 10 | 60 | 60 | Ok | clear | clear |
| S-085 | TMAH 4(12) | | 42 | Triethanol amine | 42 | 60 | 60 | Ok | clear | clear |
| S-086 | TMAH 4(12) | | 42 | MEA | 42 | 60 | 60 | Ok | clear | clear |
| S-087 | TMAH 1(3) | | 10 | | 86 | 60 | 60 | Ok | clear | clear |
| S-088 | TMAH 1(3) | | 86 | | 10 | 60 | 60 | Ok | clear | clear |
| S-089 | TMAH 4(12) | Butyl-diglycol | 42 | Ethylene glycol | 42 | 60 | 60 | Ok | clear | clear |
| S-090 | TMAH 1(3) | | 10 | | 86 | 60 | 60 | Ok | clear | clear |
| S-091 | TMAH 1(3) | | 86 | | 10 | 60 | 60 | Ok | clear | clear |
| S-092 | TMAH 4(12) | | 42 | 1,2-propanediol | 42 | 60 | 60 | Ok | clear | clear |
| S-093 | TMAH 1(3) | | 10 | | 86 | 60 | 60 | Ok | clear | clear |
| S-094 | TMAH 1(3) | | 86 | | 10 | 60 | 60 | Ok | clear | clear |
| S-095 | TMAH 4(12) | | 42 | 1-amino-2-propanol | 42 | 60 | 60 | Ok | clear | clear |
| S-096 | TMAH 1(3) | | 10 | | 86 | 60 | 60 | Ok | clear | clear |
| S-097 | TMAH 1(3) | | 86 | | 10 | 60 | 60 | Ok | clear | clear |
| S-098 | TMAH 4(12) | | 42 | Triethanol amine | 42 | 60 | 60 | Ok | clear | clear |
| S-099 | TMAH 4(12) | | 42 | MEA | 42 | 60 | 60 | Ok | clear | clear |
| S-100 | TMAH 1(3) | | 10 | | 86 | 60 | 60 | Ok | clear | clear |
| S-101 | TMAH 1(3) | | 86 | | 10 | 60 | 60 | Ok | clear | clear |
| S-102 | TMAH 4(12) | Di-methyl-ethanol-amine | 42 | Ethylene glycol | 42 | 60 | 60 | Ok | clear | clear |
| S-103 | TMAH 1(3) | | 10 | | 86 | 60 | 60 | Ok | clear | clear |
| S-104 | TMAH 1(3) | | 86 | | 10 | 60 | 60 | Ok | clear | clear |
| S-105 | TMAH 4(12) | | 42 | 1,2-propanediol | 42 | 60 | 60 | Ok | clear | clear |
| S-106 | TMAH 4(12) | | 42 | 1-amino-2-propanol | 42 | 60 | 60 | Ok | clear | clear |
| S-107 | TMAH 1(3) | | 10 | | 86 | 60 | 60 | Ok | clear | clear |
| S-108 | TMAH 1(3) | | 86 | | 10 | 60 | 60 | Ok | clear | clear |
| S-109 | TMAH 4(12) | | 42 | Triethanol amine | 42 | 60 | 60 | Ok | clear | clear |
| S-110 | TMAH 4(12) | | 42 | MEA | 42 | 60 | 60 | Ok | clear | clear |
| S-111 | TMAH 1(3) | | 10 | | 86 | 60 | 60 | Ok | clear | clear |
| S-112 | TMAH 1(3) | | 86 | | 10 | 60 | 60 | Ok | clear | clear |
| S-113 | TMAH 4(12) | Benzyaldehyde | 42 | Ethylene glycol | 42 | 60 | 60 | Ok | clear | clear |
| S-114 | TMAH 4(12) | | 42 | 1,2-propanediol | 42 | 60 | 60 | Ok | clear | clear |
| S-115 | TMAH 4(12) | | 42 | Triethanol amine | 42 | 60 | 60 | Ok | clear | clear |

Table 5 shows the performance of the embodiments of the present invention. It should be noted that the ratio of solvent A to co-solvent is not critical.

What is claimed is:

1. A composition consisting of:
   (a) an amine selected from the group consisting of tetramethylammonium hydroxide, benzyl-trimethylammonium hydroxide, tetraethylammonium hydroxide and tetrabutylammonium hydroxide, and a combination thereof;
   (b) an organic solvent A selected from the group consisting of dimethyl sulfoxide (DMSO), dimethyl sulfone (DMSO$_2$), γ-butyrolactone (BLO)(GBL), ethyl methyl ketone, 2-pentanone, 3-pentanone, 2-hexanone, isobutyl methyl ketone, 1-propanol, 2-propanol, butyl alcohol, pentanol, 1-hexanol, 1-heptanol, 1-octanol, ethyldiglycol (EDG), butyldiglycol (BDG), benzyl alcohol, benzaldehyde, tridecane, dodecane, undecane, decane, N,N-Dimethylethanolamine, di-n-propylamine, tri-n-propylamine, isobutylamine, sec-butylamine, cyclohexylamine, methylamiline, o-toluidine, m-toluidine, o-chloroaniline, m-chloroaniline, octylamine, N,N-diethylhydroxylamine, quinoline, N,N-dimethylethanolamine, and N,N-dimethylformamide, and a combination thereof;
   (c) a co-solvent selected from the group consisting of an isopropyl alcohol, an isobutyl alcohol, a sec-butyl alcohol, an isopentyl alcohol, a tort-pentyl alcohol, ethylene glycol (EG), propylene glycol, 1,2-propanediol, 1,3-propanediol, 1,2,3-propanetriol, 1-amino-2-propanol, isopropyl acetate, ethyl acetoacetate, triethanol amine, ethanolamine (MEA), formamide, dimethylacetamide (DMAC), 2-(methylamino_ethanol (NMEA), and N-ethyldiisopropylamine, and a combination thereof; and
   (d) less than 1 wt % water; and
   (e) optional additives.

2. The composition of claim 1, wherein said amine is present in an amount of 1 to 10 wt %.

3. The composition of claim 1, wherein said amine is present in an amount of 1 to 4 wt %.

4. The composition of claim 1, wherein the organic solvent A is selected from the group consisting of dimethyl sulfoxide (DMSO), benzyl alcohol, 1-propanol, 2-propanol, butyldiglycol, pentanol, N,N-dimethylethanol amine, and Benzaldehyde and a combination thereof.

5. The composition of claim 1, wherein the organic solvent A is selected from the group consisting of dimethyl sulfoxide (DMSO), benzyl alcohol, and butyldiglycol and a combination thereof.

6. The composition of claim 1, wherein the co-solvent is selected from the group consisting of ethylene glycol, 1,2-propanediol, 1-amino-2-propanol, triethanol amine, ethanolamine (MEA), and isopropyl acetate and a combination thereof.

7. The composition of claim 1, wherein the co-solvent is selected from the group consisting of ethylene glycol, triethanol amine, and ethanolamine (MEA) and a combination thereof.

8. The composition of claim 1, wherein water is present in an amount of less than 0.5 wt %.

9. A method for post-ion implantation stripping, comprising
   contacting a substrate having an implanted photoresist thereon with the composition of claim 1 under a process temperature for a period of time sufficient to remove the photoresist from the substrate.

10. The method of claim 9, wherein the process temperature is 25° C. to 90° C.

11. The method of claim 9, wherein the process temperature is 40° C. to 80° C.

12. The method of claim 9, wherein the process temperature is 60° C. to 80° C.

13. The method of claim 9, wherein the period of time is 20 min to 1 hr.

14. The composition of claim 1, wherein the amine is tetramethylammonium hydroxide (TMAH).

15. The composition of claim 14, wherein said amine is tetramethylammonium hydroxide (TMAH) which is present in an amount of 1 to 4 wt. %.

16. The composition of claim 15, wherein water is present in an amount of less than 0.5 wt %.

17. The composition of claim 1, wherein:
    the amine is tetramethylammonium hydroxide (TMAH);
    the organic solvent A is at least one selected from the group consisting of dimethyl sulfoxide (DMSO), benzyl alcohol, and butyldiglycol; and
    the co-solvent is at least one selected from the group consisting of ethylene glycol, triethanol amine, and ethanolamine (MEA).

18. The composition of claim 17, wherein water is present in an amount of less than 0.5 wt %.

19. A composition consisting of:
    (a) an amine selected from the group consisting of tetramethylammonium hydroxide, benzyl-trimethylammonium hydroxide, tetraethylammonium hydroxide and tetrabutylammonium hydroxide, and a combination thereof;
    (b) an organic solvent A selected from the group consisting of dimethyl sulfoxide (DMSO), dimethyl sulfone (DMSO$_2$), γ-butyrolactone (BLO)(GBL), ethyl methyl ketone, 2-pentanone, 3-pentanone, 2-hexanone, isobutyl methyl ketone, 1-propanol, 2-propanol, butyl alcohol, pentanol, 1-hexanol, 1-heptanol, 1-octanol, ethyldiglycol (EDG), butyldiglycol (BDG), benzyl alcohol, benzaldehyde, tridecane, dodecane, undecane, decane, N,N-Dimethylethanolamine, di-n-propylamine, tri-n-propylamine, isobutylamine, sec-butylamine, cyclohexylamine, methylamiline, o-toluidine, m-toluidine, o-chloroaniline, m-chloroaniline, octylamine, N,N-diethylhydroxylamine, quinoline, N,N-dimethylethanolamine, and N,N-dimethylformamide, and a combination thereof;
    (c) a co-solvent selected from the group consisting of an isopropyl alcohol, an isobutyl alcohol, a sec-butyl alcohol, an isopentyl alcohol, a tert-pentyl alcohol, ethylene glycol (EG), propylene glycol, 1,2-propanediol, 1,3-propanediol, 1,2,3-propanetriol, 1-amino-2-propanol, isopropyl acetate, ethyl acetoacetate, triethanol amine, ethanolamine (MEA), formamide, dimethylacetamide (DMAC), 2-(methylamino_ethanol (NMEA), and N-ethyldiisopropylamine, and a combination thereof; and
    (d) less than 1 wt % water.

20. The composition of claim 1, wherein said optional additives are present and are selected from the group consisting of a chelating agent, a surfactant and a mixture thereof.

21. The composition of claim 20, wherein said additive is a chelating agent selected from the group consisting of ethylenediaminetetraacetic acid, diethylenetriaminepentaacetic acid, 2,4-pentanedione and a mixture thereof.

22. The composition of claim 20, wherein said additive is a surfactant selected from the group consisting of a non-ionic alkoxylated alcohol, a nonyl-phenol, a nonyl-ethoxylate and a mixture thereof.

* * * * *